(12) United States Patent
Sheng et al.

(10) Patent No.: US 12,520,454 B2
(45) Date of Patent: Jan. 6, 2026

(54) LIQUID COOLING HEAT DISSIPATION SYSTEM

(71) Applicant: Suzhou MetaBrain Intelligent Technology Co., Ltd., Suzhou (CN)

(72) Inventors: Jian Sheng, Suzhou (CN); Cheng Liu, Suzhou (CN); Dinglin Hu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 0 days.

(21) Appl. No.: 19/115,628

(22) PCT Filed: Aug. 8, 2024

(86) PCT No.: PCT/CN2024/110629
§ 371 (c)(1),
(2) Date: Mar. 26, 2025

(87) PCT Pub. No.: WO2025/031442
PCT Pub. Date: Feb. 13, 2025

(65) Prior Publication Data
US 2025/0261335 A1    Aug. 14, 2025

(30) Foreign Application Priority Data
Aug. 8, 2023   (CN) .................. 202310991519.X

(51) Int. Cl.
*H05K 7/20* (2006.01)
(52) U.S. Cl.
CPC ..... *H05K 7/20272* (2013.01); *H05K 7/20263* (2013.01); *H05K 7/20781* (2013.01);
(Continued)

(58) Field of Classification Search
CPC .......... H05K 7/20272; H05K 7/20263; H05K 7/20781; H05K 7/20836; H05K 7/20218;
(Continued)

(56) References Cited

U.S. PATENT DOCUMENTS

| | | | | |
|---|---|---|---|---|
| 4,336,763 A | * | 6/1982 | Wolff | F04F 1/06 114/74 R |
| 4,408,960 A | * | 10/1983 | Allen | F04F 1/10 417/54 |

(Continued)

FOREIGN PATENT DOCUMENTS

| | | |
|---|---|---|
| CN | 108777925 A | 11/2018 |
| CN | 114051356 A | 2/2022 |

(Continued)

OTHER PUBLICATIONS

International Search Report of corresponding PCT application (PCT/CN2024/110629) Nov. 13, 2024 including English translation (5 pages).

(Continued)

*Primary Examiner* — Joel M Attey
(74) *Attorney, Agent, or Firm* — Crowell & Moring LLP

(57) ABSTRACT

A liquid cooling heat dissipation system is disclosed, including: a primary side cooling unit, a secondary side cooling unit and a heat exchange unit, wherein an outlet of the primary side cooling unit is in communication with a primary side inlet of the heat exchange unit, and a primary side outlet of the heat exchange unit is in communication with an inlet of the primary side cooling unit.

19 Claims, 5 Drawing Sheets

(52) U.S. Cl.
CPC ...... *H05K 7/20836* (2013.01); *F28F 2265/06* (2013.01); *F28F 2265/16* (2013.01); *F28F 2265/20* (2013.01); *H05K 7/20736* (2013.01)

(58) Field of Classification Search
CPC .............. H05K 7/20763; F28F 2265/06; F28F 2265/16; F28F 2265/20
USPC ........................................................ 165/80.4
See application file for complete search history.

(56) References Cited

U.S. PATENT DOCUMENTS

| | | | | |
|---|---|---|---|---|
| 5,278,495 | A * | 1/1994 | Beaton ............... | G01R 31/2817 324/763.01 |
| 6,361,697 | B1 * | 3/2002 | Coury .................... | C02F 1/725 210/759 |
| 9,185,830 | B2 * | 11/2015 | Chainer ............. | H05K 7/20263 |
| 9,326,429 | B2 * | 4/2016 | Chainer ............. | H05K 7/20836 |
| 12,101,910 | B1 * | 9/2024 | Xin .................... | H05K 7/20272 |
| 2018/0035569 | A1 * | 2/2018 | Harrington ........ | H05K 7/20281 |
| 2020/0229322 | A1 * | 7/2020 | Bostick .............. | H05K 7/20772 |
| 2022/0306949 | A1 * | 9/2022 | Nierode ................... | C10G 9/36 |

FOREIGN PATENT DOCUMENTS

| | | | |
|---|---|---|---|
| CN | 114286585 | A | 4/2022 |
| CN | 114518794 | A | 5/2022 |
| CN | 114938613 | A | 8/2022 |
| CN | 114967885 | A | 8/2022 |
| CN | 115623762 | A | 1/2023 |
| CN | 116723685 | A | 9/2023 |
| DE | 102022002696 | B3 | 3/2023 |
| WO | WO 2022242509 | A1 | 11/2022 |

OTHER PUBLICATIONS

Written Opinion of International Searching Authority of corresponding PCT application (PCT/CN2024/110629) Nov. 13, 2024 including English translation (10 pages).

Search report of corresponding CN priority application (CN202310991519.X) Sep. 12, 2023 including English translation (4 pages).

First Office Action of corresponding CN priority application (CN202310991519.X) Sep. 14, 2023 including English translation (12 pages).

Notification to Grant Patent Right for Invention of corresponding CN priority application (CN202310991519.X) Oct. 8, 2023 including English translation, and issued patent and English translation of allowed claims of corresponding CN Priority Application No. CN202310991519.X (35 pages).

* cited by examiner

LIQUID COOLING HEAT DISSIPATION SYSTEM

CROSS-REFERENCE TO RELATED APPLICATION

This application is the national phase application of International Application No. PCT/CN2024/110629, filed Aug. 8, 2024, which claims priority to Chinese Patent Application No. 202310991519.X, filed on Aug. 8, 2023 in China National Intellectual Property Administration and entitled "LIQUID COOLING HEAT DISSIPATION SYSTEM". The contents of International Application No. PCT/CN2024/110629 and Chinese Patent Application No. 202310991519.X are herein incorporated by reference in their entireties.

FIELD

The present application relates to the technical field of liquid cooling, and in particular to a liquid cooling heat dissipation system.

BACKGROUND

With the rapid development of information and data technology and its application, the performance of the core components of a server, such as CPU and GPU, is significantly improved, and their power consumption and heat generation are also multiplied. Therefore, the traditional air-cooling heat dissipation technology cannot meet the heat dissipation requirements of the server and data center machine room. In order to further improve heat dissipation capacity of the server and the data center machine room, more advanced liquid cooling technology is commonly used for heat dissipation of the server and the data center machine room. At present, there are two kinds of liquid cooling technology for the server: immersion liquid cooling and cold plate liquid cooling technologies. For the immersion liquid cooling, the server is directly immersed into special coolant for server heat dissipation treatment, due to its high cost of comprehensive use, difficult maintenance and other reasons, its application scale is small. For the cold plate liquid cooling, a liquid cooling cold plate in direct contact with server heat-generating components (such as CPU, GPU, etc.) is used for heat dissipation, and the heat dissipation principle thereof is that a coolant pump drive heat exchange system drives a coolant (water, glycol, etc.) to continuously flow through an inner channel of the cold plate, and the coolant exchanges heat with the server heat-generating components through a plate wall of the cold plate in the channel to take away the heat generated by the operation of the server heat-generating components to achieve an objective of heat dissipation.

At present, the coolant circulation line according to the server liquid cooling technology is a positive pressure system. When the line is damaged or the joint is loose, the leakage detection line can only be used for detecting the leakage of the line when the coolant has leaked to the designated position in the interior of the server. At this time, the leakage has occurred and the server has been damaged, resulting in low safety of the liquid cooling heat dissipation system.

SUMMARY

On this basis, the present application provides a liquid cooling heat dissipation system to improve safety of the liquid cooling heat dissipation system.

In one aspect, a liquid cooling heat dissipation system is provided, where the liquid cooling heat dissipation system includes a primary side cooling unit, a secondary side cooling unit and a heat exchange unit, where an outlet of the primary side cooling unit is in communication with a primary side inlet of the heat exchange unit, and a primary side outlet of the heat exchange unit is in communication with an inlet of the primary side cooling unit; and the secondary side cooling unit includes a pump drive unit, a static pressure water tank and a load unit, where an inlet of the pump drive unit is in communication with an outlet of the load unit, an outlet of the pump drive unit is in communication with the static pressure water tank, the static pressure water tank is in communication with the atmosphere and is also in communication with a secondary side inlet of the heat exchange unit, a secondary side outlet of the heat exchange unit is in communication with an inlet of the load unit, and the pump drive unit is a water pump for pumping water to an inlet side of the pump drive unit.

In some embodiments, the secondary side cooling unit includes a secondary side liquid return unit, where the secondary side liquid return unit includes an exhaust tank, a bottom outlet of the static pressure water tank and the outlet of the load unit are both in communication with a top inlet of the exhaust tank, a bottom outlet of the exhaust tank is in communication with the inlet of the pump drive unit, and a pressure-stabilizing exhaust valve is provided at a top of the exhaust tank.

In some embodiments, exhaust pressure-stabilizing pressure sensors are further provided at the top of the exhaust tank and are all in communication with an interior of the exhaust tank, the bottom outlet of the static pressure water tank is in communication with the top inlet of the exhaust tank via a secondary side bypass liquid return line, and a secondary side bypass regulating unit and a secondary side bypass check valve are provided on the secondary side bypass liquid return line.

In some embodiments, a system liquid supply line is provided between a bottom of the static pressure water tank and the top inlet of the exhaust tank, and a secondary side system liquid supply pump and a secondary side system liquid supply check valve are provided on the system liquid supply line.

In some embodiments, an automatic water tank liquid supply line and a manual water tank liquid supply line are connected to a top of the static pressure water tank, where the manual water tank liquid supply line includes a manual secondary side liquid supply on-off valve, a secondary side liquid supply filter and a secondary side water tank liquid supply pump which are in communication successively, the manual secondary side liquid supply on-off valve is in communication with the top of the static pressure water tank, and the secondary side water tank liquid supply pump is in communication with a liquid supply water tank; the automatic water tank liquid supply line has one end in communication with the top of the static pressure water tank and the other end in communication with a pressurized coolant delivery line.

In some embodiments, a drain line is connected to the bottom of the static pressure water tank and is provided with a solenoid valve, and an overflow line is connected to the top of the static pressure water tank and is in communication with the drain line.

In some embodiments, an automatic secondary side water quality detection monitoring unit is connected to the bottom of the static pressure water tank and is configured to detect a water quality state of a secondary side coolant.

In some embodiments, the pump drive unit includes a first pump drive unit and a second pump drive unit arranged in parallel, and the first pump drive unit and the second pump drive unit each include a secondary side liquid return inlet on-off valve, a secondary side drive pump inlet shock-absorbing pipe, a secondary side drive pump, a secondary side drive pump outlet shock-absorbing pipe, a secondary side liquid return check valve and a secondary side liquid return outlet on-off valve which are in communication successively, where the secondary side liquid return inlet on-off valve is in communication with the bottom outlet of the exhaust tank, and the secondary side liquid return outlet on-off valve is in communication with the top of the static pressure water tank.

In some embodiments, a secondary side liquid return main line on-off valve, a secondary side ultraviolet sterilization device, a secondary side liquid return pressure sensor, a secondary side liquid return temperature sensor and a secondary side liquid return flow sensor are connected successively between the load unit and the top of the exhaust tank, the secondary side liquid return flow sensor being in communication with the top of the exhaust tank, and the secondary side liquid return main line on-off valve being in communication with the load unit.

In some embodiments, a secondary side leakage detecting device is connected in parallel between the secondary side liquid return pressure sensor and the secondary side liquid return flow sensor, and the secondary side leakage detecting device is a liquid bubble detector.

In some embodiments, the secondary side cooling unit includes a secondary side liquid supply unit, the secondary side liquid supply unit including a secondary side liquid supply pressure sensor, three secondary side liquid supply temperature sensors, a secondary side coolant visual monitoring device and a secondary side liquid supply main line on-off valve connected successively, the secondary side liquid supply pressure sensor being in communication with the secondary side outlet of the heat exchange unit, and the secondary side liquid supply main line on-off valve being in communication with the load unit.

In some embodiments, the secondary side liquid supply pressure sensor includes secondary side liquid supply inlet pressure sensors and secondary side liquid supply outlet pressure sensors, and a secondary side first liquid supply module and a secondary side second liquid supply module arranged in parallel are connected between the respective secondary side liquid supply inlet pressure sensor and secondary side liquid supply outlet pressure sensor; the secondary side first liquid supply module and the secondary side second liquid supply module each include secondary side inlet on-off valves, a secondary side drainage and water quality sampling valve, a secondary side filter and secondary side outlet on-off valves connected successively, where the secondary side inlet on-off valves are all in communication with the secondary side liquid supply inlet pressure sensors, and the secondary side outlet on-off valves are all in communication with the secondary side liquid supply outlet pressure sensors.

In some embodiments, the primary side cooling unit includes a primary side liquid supply unit and a primary side cooling machine pump drive device, and the primary side liquid supply unit includes a primary side liquid supply main line on-off valve, a primary side ultraviolet sterilization device, a primary side liquid supply temperature sensor, a primary side liquid supply pressure sensor, and an automatic primary side liquid supply exhaust valve connected successively, the primary side liquid supply main line on-off valve is in communication with an outlet of the primary side cooling machine pump drive device, and the automatic primary side liquid supply exhaust valve is in communication with the primary side inlet of the heat exchange unit.

In some embodiments, the primary side liquid supply pressure sensor includes primary side inlet pressure sensors and primary side outlet pressure sensors, and a primary side first liquid supply module and a primary side second liquid supply module arranged in parallel are connected between the respective primary side inlet pressure sensor and primary side outlet pressure sensor; the primary side first liquid supply module and the primary side second liquid supply module each include primary side inlet on-off valves, a primary side drainage and water quality sampling valve, a primary side filter and primary side outlet on-off valves connected successively, where the primary side inlet on-off valves are all in communication with the primary side inlet pressure sensors, and the primary side outlet on-off valves are all in communication with the primary side outlet pressure sensors.

In some embodiments, the primary side cooling unit includes a primary side liquid return unit, where the primary side liquid return unit includes a primary side liquid return main line on-off valve, a primary side coolant visual monitoring device, a primary side coolant flow sensor, a primary side liquid return temperature sensor, a primary side liquid return pressure sensor and a primary side coolant regulating device connected successively, the primary side liquid return main line on-off valve is in communication with an inlet of the primary side cooling machine pump drive device, and the primary side coolant regulating device is in communication with the primary side outlet of the heat exchange unit.

In some embodiments, the liquid cooling heat dissipation system further includes an external pipe leakage detecting device, where the external pipe leakage detecting device includes a resistance sensor.

In some embodiments, the primary side cooling machine pump drive device includes an outdoor cooling machine, a primary side coolant drive pump, a constant-pressure water supply device and an automatic dosing device.

In another aspect, a liquid cooling heat dissipation system is provided, and the liquid cooling heat dissipation system includes:
   a pump drive unit configured to performing a water pumping operation on a line on an inlet side of the pump drive unit, such that a line flowing from a static pressure water tank to the pump drive unit in a secondary side cooling unit is in a negative pressure state to form a negative pressure line;
   a static pressure water tank in communication with ambient atmospheric pressure and used for establishing a pressure difference between the ambient atmospheric pressure and the negative pressure in the negative pressure line to establish a circulation flow power of the coolant in the secondary side cooling unit via the pressure difference; and
   a load unit configured to deliver a low-temperature coolant to a load and performing heat exchange with the load under the circulation flow power to form a high-temperature coolant.

In some embodiments, the system further includes:
   a secondary side liquid return temperature sensor used for collecting a temperature value of a secondary side liquid return unit, and establishing a temperature feedback mechanism via the collected temperature value, a preset temperature value and the pump drive unit, and in response to the temperature value collected by the secondary side liquid return temperature sensor being higher than the preset temperature value, increasing water pumping power of the pump drive unit to reduce the negative pressure of the negative pressure line; and increasing the circulation flow power by increasing the pressure difference to further increase a flow in the secondary side cooling unit pipe, such that the temperature value of the secondary side liquid return temperature sensor is lower than the preset temperature value.

In some embodiments, the system further includes:

a secondary side bypass regulating unit configured to adjusting a valve opening degree of the secondary side bypass regulating unit, such that a flow of an outlet side of the pump drive unit exceeding a desired amount of the coolant of the load unit flows to an exhaust tank and returns to the inlet side of the pump drive unit, in response to the desired amount of the coolant of the load unit being lower than a minimum flow of the outlet side of the pump drive unit.

The above-mentioned technical solution of the present application has the following advantages over the related art:

for the above-mentioned liquid cooling heat dissipation system, the pump drive unit performs a water pumping operation on the line at the inlet side thereof, such that the line between the bottom outlet of the static pressure water tank and the inlet of the pump drive unit is in a negative pressure state, forming a negative pressure line; a coolant is stored in the static pressure water tank, and the static pressure water tank is in communication with the ambient atmosphere; a pressure difference between the ambient atmospheric pressure and the negative pressure of the load line, where the pressure difference establishes the circulation flow power of the coolant in the secondary side cooling unit, and the secondary side negative pressure line is always in a negative pressure state; and the negative pressure line in the negative pressure state can effectively reduce the leakage of the coolant in the secondary side cooling unit line, and effectively improve the safety of the liquid cooling heat dissipation system and the data center.

BRIEF DESCRIPTION OF THE DRAWINGS

To describe the technical solutions of the embodiments of the present application more clearly, the following briefly introduces the accompanying drawings required for describing the embodiments. Apparently, the accompanying drawings in the following description show only some embodiments of the present application, and a person of ordinary skill in the art may still derive other drawings from these accompanying drawings without creative efforts.

Figure 1:
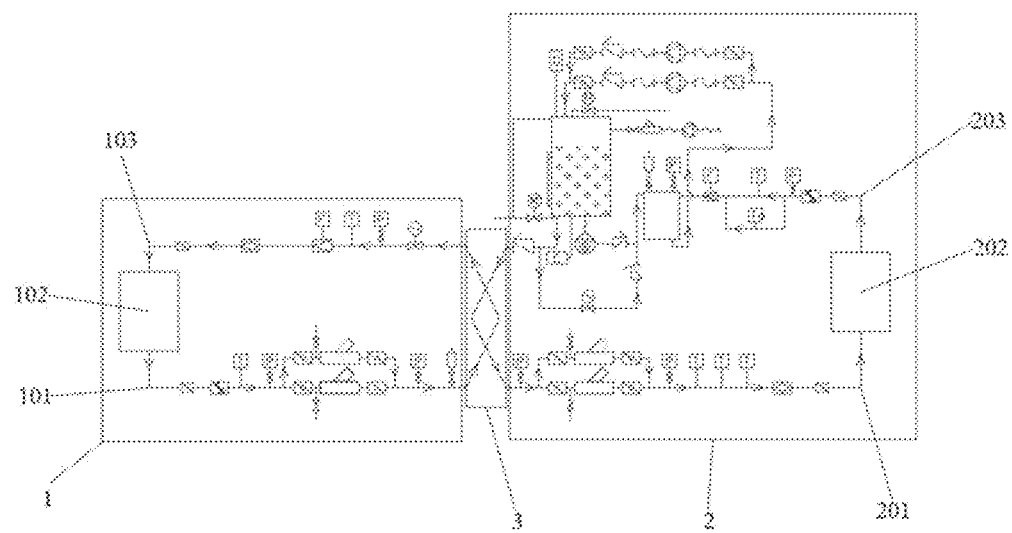
FIG. 1 is a system structural diagram showing a liquid cooling heat dissipation system according to an embodiment of the present application.

DESCRIPTION OF REFERENCE NUMERALS 1. primary side cooling unit; 101. primary side liquid supply unit; 102. primary side cooling machine pump drive device; 103. primary side liquid return unit; 104. primary side liquid supply main line on-off valve; 105. primary side ultraviolet sterilization device; 106. primary side liquid supply temperature sensor; 107. automatic primary side liquid supply exhaust valve; 108. primary side inlet pressure sensor; 109. primary side outlet pressure sensor; 110. primary side first liquid supply module; 111. primary side second liquid supply module; 112. primary side inlet on-off valve; 113. primary side drainage and water quality sampling valve; 114. primary side filter; 115. primary side outlet on-off valve; 116. primary side liquid return main line on-off valve; 117. primary side coolant visual monitoring device; 118. primary side coolant flow sensor; 119. primary side liquid return temperature sensor; 120. primary side liquid return pressure sensor; 121. primary side coolant regulating device;

2. secondary side cooling unit; 201. secondary side liquid supply unit; 202. load unit; 203. secondary side liquid return unit; 204. pump drive unit; 205. static pressure water tank; 206. exhaust tank; 207. pressure-stabilizing exhaust valve; 208. exhaust pressure-stabilizing pressure sensor; 209. secondary side bypass liquid return line; 210. secondary side bypass regulating unit; 211. secondary side bypass check valve; 212. system liquid supply line; 213. secondary side system liquid supply pump; 214. secondary side system liquid supply check valve; 215. automatic water tank liquid supply line; 216. manual water tank liquid supply line; 217. manual secondary side liquid supply on-off valve; 218. secondary side liquid supply filter; 219. secondary side water tank liquid supply pump; 220. drain line; 221. solenoid valve; 222. overflow line; 223. automatic secondary side water quality detection monitoring unit; 224. first pump drive unit; 225. second pump drive unit; 226. secondary side liquid return inlet on-off valve; 227. secondary side drive pump inlet shock-absorbing pipe; 228. secondary side drive pump; 229. secondary side drive pump outlet shock-absorbing pipe; 230. secondary side liquid return check valve; 231. secondary side liquid return outlet on-off valve; 232. secondary side liquid return main line on-off valve; 233. secondary side ultraviolet sterilization device; 234. secondary side liquid return pressure sensor; 235. secondary side liquid return temperature sensor; 236. secondary side liquid return flow sensor; 237. secondary side leakage detecting device; 238. secondary side liquid supply temperature sensor; 239. secondary side coolant visual monitoring device; 240. secondary side liquid supply main line on-off valve; 241. secondary side supply inlet pressure sensor; 242. secondary side liquid supply outlet pressure sensor; 243. secondary side first liquid supply module; 244. secondary side second liquid supply module; 245. secondary side inlet on-off valve; 246. secondary side drainage and water quality sampling valve; 247. secondary side filter; 248. secondary side outlet on-off valve; 249. secondary side main line check valve; 250. atmosphere communication line;

3. heat exchange unit.

DETAILED DESCRIPTION

For that the objects, aspects and advantages of the present application may be more clearly understood, a more particular description of the present application, briefly summarized below, may be had by reference to the appended drawings and examples. It should be understood that the particular embodiments described herein are illustrative only and are not restrictive.

At present, the conventional cold plate liquid cooling pump drive heat exchange system has the following disadvantages:

(1) The existing coolant circulation line is a positive pressure system, and the positive pressure is used for driving a coolant to provide power for a circulation flow of the coolant, i.e., the pressure in the coolant circulation line is greater than the ambient atmospheric pressure, and the coolant is driven to circulate continuously in the coolant circulation line by means of the pressure generated by continuous rotation of the water pump in the pump drive heat exchange system, and when the line is damaged or the joint is loosened, the coolant leaks and conducts electricity, resulting in server damage; in addition, an effect exerted by the existing remedial measures for leakage detection of the coolant is not ideal, and the leakage detection line can only be used for detecting the line leakage when the coolant has leaked to a designated position in the interior of the server, at this time, the leakage has occurred and the server has been damaged, and there is no effective measure for blocking the line leakage in the pump drive heat exchange system.

(2) There are no active measures to disinfect and kill microbial bacteria. After long-term operation of the system, biological sludge and acidic substances produced by microorganisms will cause coolant pollution, corrosion damage of coolant circulation line and liquid cooling server. At the same time, when the number of microbial bacteria reaches a certain degree, the system can only be completely cleaned through a cooling line and the coolant can be replaced completely to ensure the normal operation of the system, resulting in a large amount of manpower and material waste.

(3) Without on-line monitoring and alarming measures for coolant quality, it is easy to cause the coolant circulation server that does not meet the water quality requirements, resulting in the occurrence of blockage and corrosion of the cold plate line of the server.

(4) There is no coolant shut-off device before and after the vulnerable parts of the whole system and the parts need to be cleaned frequently; the coolant of the system needs to be completely drained before maintenance of the system, which makes it difficult to repair and wastes coolant to a certain extent.

(5) Without closed-loop self-adaptive function, the pump drive heat exchange system can only operate according to the set operating parameters, without a self-sensing device, it is unable to obtain the real operating state of the system in time, and it is unable to automatically adjust the operating state of the apparatus according to the usage requirements of the system, including but not limited to a filter state sensing determination function, a heat exchanger state sensing determination function, an automatic system liquid supply function and an active overflow function, etc.

In some embodiments, referring to FIG. 1, FIG. 1 is a system structural diagram showing a liquid cooling heat dissipation system according to an embodiment of the present application.

As shown in FIG. 1, the liquid cooling heat dissipation system includes a primary side cooling unit 1, a secondary side cooling unit 2 and a heat exchange unit 3, where an outlet of the primary side cooling unit 1 is in communication with a primary side inlet of the heat exchange unit 3, and a primary side outlet of the heat exchange unit 3 is in communication with an inlet of the primary side cooling unit 1; an outlet of the secondary side cooling unit 2 is in communication with a secondary side inlet of the heat exchange unit 3, and an inlet of the secondary side cooling unit 2 is in communication with the secondary side outlet of the heat exchange unit 3. The operating principle of liquid cooling heat dissipation system is: a coolant (a low-temperature coolant) generated by the primary side cooling unit 1 flows into the primary side inlet of the heat exchange unit 3 through the outlet of the primary side cooling unit 1, a high-temperature coolant formed after the coolant (a low-temperature coolant) of the secondary side cooling unit 2 exchanges heat with a load enters the secondary side inlet of the heat exchange unit 3 through the outlet of the secondary side cooling unit 2, and the primary side coolant (a low-temperature coolant) entering the heat exchange unit 3 exchanges heat with the secondary side high-temperature coolant entering the heat exchange unit 3 in the heat exchange unit 3, such that the primary side coolant entering the heat exchange unit 3 becomes a high-temperature coolant, and then the high-temperature coolant becomes a coolant (a low-temperature coolant) via the primary side cooling unit 1; the high-temperature coolant entering the secondary side of the heat exchange unit 3 is changed into a coolant (a low-temperature coolant), and the coolant (the low-temperature coolant) exchanges heat with the load to form a high-temperature coolant, and circulates and returns to achieve cooling of the load by the liquid cooling heat dissipation system. The heat exchange unit 3 is composed of a brazed integrated plate heat exchanger, and is used for heat exchange between the primary side cooling unit 1 and the secondary side cooling unit 2. By means of heat exchange fins and counterflow heat exchange technology, the high-temperature coolant in the secondary side cooling unit 2 is converted into the low-temperature coolant, and at the same time, the low-temperature coolant in the primary side cooling unit 1 is converted into the high-temperature coolant, and finally the heat generated by the load unit 202 (load such as a secondary side server) is transferred and converted to the primary side cooling unit 1.

Figure 2:
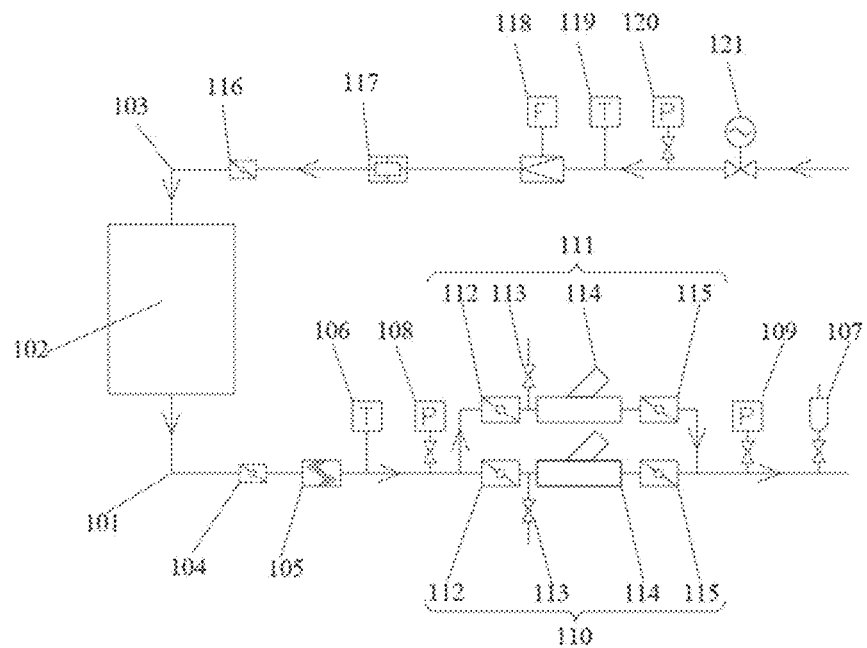
FIG. 2 is a structural diagram showing a primary side cooling unit (a primary side liquid supply unit and a primary side liquid return unit) of a liquid cooling heat dissipation system according to an embodiment of the present application.

In some embodiments, as shown in FIG. 2, FIG. 2 is a structural diagram showing a primary side cooling unit (including a primary side liquid supply unit) of a liquid cooling heat dissipation system according to an embodiment of the present application.

The primary side cooling unit 1 includes a primary side cooling machine pump drive device 102, a primary side liquid supply unit 101, and a primary side liquid return unit 103. The primary side cooling machine pump drive device 102 provides a cooling source utilizing an outdoor cooling machine, i.e., a coolant, such as water, glycol, etc. for the entire liquid cooling heat dissipation system. The coolant supplied from the primary side cooling machine pump drive device 102 is delivered to the heat exchange unit 3 via the primary side liquid supply unit 101, and the primary side coolant in the heat exchange unit 3 exchanges heat with the secondary side high-temperature coolant and then returns to the primary side cooling machine pump drive device 102 via the primary side liquid return unit 103. The primary side cooling machine pump drive device 102 includes a primary side coolant drive pump, and the primary side coolant drive pump provides the flow power for the coolant in the primary side liquid supply unit 101 and the primary side liquid return unit 103, thereby realizing a circulation flow of the primary side coolant unit.

The primary side liquid supply unit 101 includes a primary side liquid supply main line on-off valve 104, a primary side ultraviolet sterilization device 105, a primary side liquid supply temperature sensor 106, a primary side inlet pressure sensor 108, a primary side outlet pressure sensor 109, an automatic primary side liquid supply exhaust valve 107 connected successively, the primary side liquid supply main line on-off valve 104 is in communication with the outlet of the primary side cooling machine pump drive device 102, and the automatic primary side liquid supply exhaust valve 107 is in communication with the primary side inlet of the heat exchange unit 3.

The primary side liquid supply main line on-off valve is used for realizing the overall on-off between the primary side liquid supply unit 101 and the primary side cooling machine pump drive device 102 to perform the shut-off operation of the primary side liquid supply main line when the subsequent line-related components need to be maintained and the primary side cooling machine pump drive device 102 is integrally migrated. The primary side ultraviolet sterilization device 105 achieves active disinfection and killing of the microbial bacteria in the coolant of the primary side cooling unit 1 using the ultraviolet sterilization technology to prevent the water quality of the coolant polluting the coolant circulation line caused by the microbial bacteria exceeding the standard in the coolant of the primary side cooling unit 1, or the corrosion damage of the liquid cooling server caused by the microbial bacteria exceeding the standard, etc., and improve the water quality of the liquid cooling heat dissipation system. The primary side liquid supply temperature sensor 106 is used for reading and outputting the temperature of the line of the primary side liquid supply unit 101, and outputting the temperature of the line of the primary side liquid supply unit 101 to the primary side cooling machine pump drive device 102, such that a control system (not shown in the figure) adjusts the operating state of the primary side system via the primary side cooling machine pump drive device 102 according to specific usage requirements, for example: when the temperature value acquired by the primary side liquid supply temperature sensor 106 is higher than the preset temperature value, the power of the primary side coolant drive pump in the primary side cooling machine pump drive device 102 is adjusted or the cooling capacity of the outdoor cooling machine in the primary side cooling machine pump drive device 102 is adjusted by the control system to reduce the temperature value acquired by the primary side liquid supply temperature sensor 106 to be within the preset temperature value. The primary side liquid supply pressure sensor is used for detecting the pressure of the coolant on the line of the primary side liquid supply unit 101. The automatic primary side liquid supply exhaust valve 107 is used for automatically discharging the gas mixed in the line of the primary side liquid supply unit 101 to avoid the occurrence of cavitation damage to the line caused by the gas in the line, and improve the safety of the liquid cooling heat dissipation system.

In some embodiments, the primary side liquid supply pressure sensor includes a primary side inlet pressure sensor 108 (located at the inlet side of the primary side filter 114) and a primary side outlet pressure sensor 109 (located at the outlet side of the primary side filter 114), and as shown in FIG. 2, a primary side first liquid supply module 110 and a primary side second liquid supply module 111 arranged in parallel are connected between the primary side inlet pressure sensor 108 and the primary side outlet pressure sensor 109. The primary side first liquid supply module 110 and the primary side second liquid supply module 111 each include primary side inlet on-off valves 112, primary side drainage and water quality sampling valves 113, primary side filters 114 and primary side outlet on-off valves 115 connected successively, where the primary side inlet on-off valves 112 are all in communication with the primary side inlet pressure sensor 108, and the primary side outlet on-off valves 115 are all in communication with the primary side outlet pressure sensor 109.

The primary side filter 114 is located between the primary side inlet pressure sensor 108 and the primary side outlet pressure sensor 109; the primary side inlet pressure sensor 108 and the primary side outlet pressure sensor 109 together constitute a filter element state monitoring unit of the primary side filter 114; the state monitoring operation of the primary side filter 114 is realized by a difference between the primary side inlet pressure and the primary side outlet pressure; when the pressure difference between the two is greater than a preset pressure difference, it is indicated that the primary side filter 114 is in a blocked state; and the control system automatically reminds relevant maintenance personnel to perform operations such as cleaning and replacing the filter element of the primary side filter 114. The primary side inlet on-off valve 112 of the primary side first liquid supply module 110, the primary side drainage and water quality sampling valve 113, the primary side filter 114, and the primary side inlet on-off valve 112 of the primary side second liquid supply module 111, the primary side drainage and water quality sampling valve 113, the primary side filter 114 and the primary side outlet on-off valve 115 together constitute a primary side coolant filtering line assembly which adopts a double-filtration line design with one on use and one on standby to ensure that the normal operation of the system is not affected when a problem occurs in one of the lines or the filter element is cleaned and replaced; i.e., when a problem occurs in the primary side first liquid supply module 110 or the filter element is replaced, the line of the primary side first liquid supply module 110 is cut off by the primary side inlet on-off valve 112 and the primary side outlet on-off valve 115 of the primary side first liquid supply module 110, and the primary side second liquid supply module 111 operates normally; when a problem occurs in the primary side second liquid supply module 111 or the filter element is replaced, the line of the primary side second liquid supply module 111 is cut off by the primary side inlet on-off valve 112 and the primary side outlet on-off valve 115 of the primary side second liquid supply module 111, and the primary side first liquid supply module 110 operates normally. The primary side drainage valve and the water quality sampling valve realize the discharge operation of the coolant in the primary side filtering line assembly, and the primary side first liquid supply module 110 and the primary side second liquid supply module 111 cooperate to realize the cleaning and replacement of the filter element and the line maintenance in a non-stop operation state of the primary side cooling machine pump drive device 102, which improves the maintenance efficiency and reduces the maintenance cost. In addition, the convenient sampling operation of the coolant in the primary side cooling unit 1 can be realized through the primary side drainage valve and the water quality sampling valve, and then the sampling and inspection operation of the coolant in the primary side cooling unit 1 can be realized in the non-stop operation state. The primary side filter 114 is designed with a stainless-steel flushable filter element, which can complete a removal operation of particulate matter in the coolant of the primary side cooling unit 1 to ensure that the water quality state of the coolant of the primary side cooling unit 1 meets the use requirements of the primary side cooling unit 1, and further improve the water quality of the coolant.

In some embodiments, as shown in FIG. 2, FIG. 2 is a structural diagram showing a primary side cooling unit (including a primary side liquid return unit) of a liquid cooling heat dissipation system according to an embodiment of the present application.

The primary side liquid return unit 103 is responsible for delivering the high-temperature coolant at the primary side passing through the heat exchange unit 3 to the primary side cooling machine pump drive device 102 to perform a cooling operation. The primary side liquid return unit 103 includes a primary side liquid return main line on-off valve 116, a primary side coolant visual monitoring device 117, a primary side coolant flow sensor 118, a primary side liquid return temperature sensor 119, a primary side liquid return pressure sensor 120 and a primary side coolant regulating device 121 connected successively, the primary side liquid return main line on-off valve 116 is in communication with an inlet of the primary side cooling machine pump drive device 102, and the primary side coolant regulating device 121 is in communication with the primary side outlet of the heat exchange unit 3.

The primary side liquid return main line on-off valve is used for overall on-off between the primary side liquid return unit 103 and the primary side cooling machine pump drive device 102 to perform a shut-off operation of the primary side liquid return main line when the relevant components of the primary side liquid return unit 103 need to be maintained and the primary side cooling machine pump drive heat exchange device is integrally migrated. The primary side coolant visual monitoring device 117 is used for monitoring a circulation state of the coolant of the primary side cooling unit 1 and is designed with transparent toughened glass. An operator can visually and clearly check the circulation state of the coolant at a zero distance, including but not limited to the turbidity of the water quality, impurities in the water and the amount of air bubbles, etc. to improve the water quality monitoring capability of the liquid cooling heat dissipation system. The primary side coolant flow sensor 118 is used for monitoring and using the primary side cooling unit 1 coolant flow, and can output and upload the primary side cooling unit 1 coolant flow data to the control system, such that the control system can master the primary side cooling unit 1 coolant flow information in real time and make relevant adjustments according to actual needs, i.e., when the coolant flow collected by the primary side coolant flow sensor 118 does not reach a corresponding preset value, power of the primary side coolant drive pump in the primary side cooling machine pump drive heat exchange device is increased; or when the flow of the coolant collected by the primary side coolant flow sensor 118 exceeds a corresponding preset value, the power of the primary side coolant drive pump in the primary side cooling machine pump drive heat exchange device is reduced. The operating principle of the primary side liquid return temperature sensor 119 can be seen referring to the primary side liquid supply temperature sensor 106. The primary side liquid return pressure sensor 120 is used for collecting the liquid return pressure of the line of the primary side liquid return unit 103, and is equivalent to a primary side outlet pressure value of the heat exchange unit 3; the primary side liquid supply pressure sensor is used for collecting the liquid supply pressure of the primary side liquid supply unit 101, and is equivalent to a primary side inlet pressure value of the heat exchange unit 3; the primary side inlet pressure value of the heat exchange unit 3 is compared with the primary side outlet pressure value to obtain a pressure difference at the primary side inlet and outlet of the heat exchange unit 3, and the operating state of the heat exchange unit 3 can be determined according to the pressure difference; and if the pressure difference is too large, it is indicated there might be blockage in the interior of the heat exchange unit 3, and the maintenance personnel gives maintenance at the same time to improve maintenance efficiency. At the same time, the liquid return pressure collected by the primary side liquid return pressure sensor 120 can be used by the control system to adjust the operating state of the primary side cooling unit 1 according to specific requirements for use, such as adjusting the flow of the primary side cooling machine pump drive heat exchange device according to actual needs. The primary side coolant regulating device 121 is designed with an electric proportional valve, and can adjust the relevant parameters of the primary side cooling unit 1, such as pressure, flow and temperature of the coolant, by adjusting a valve opening degree to meet the specific use requirements of the primary side cooling unit 1.

Figure 3:
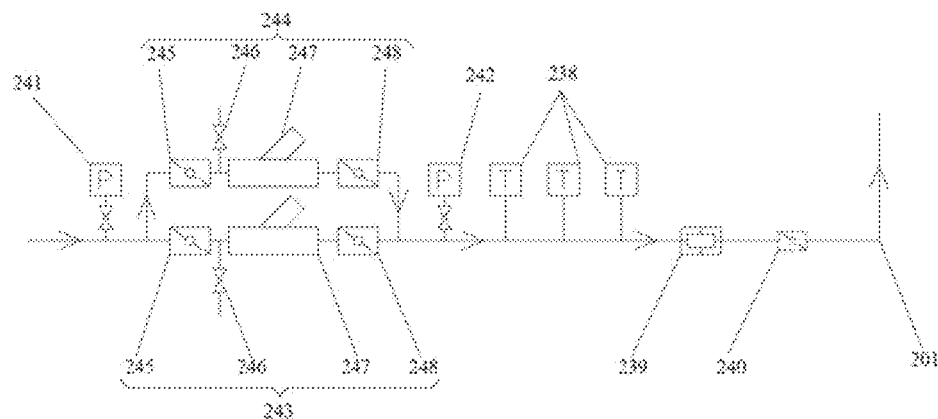
FIG. 3 is a structural diagram showing a secondary side liquid supply unit of a liquid cooling heat dissipation system according to an embodiment of the present application.

In some embodiments, as shown in FIG. 3, FIG. 3 is a structural diagram showing a secondary side liquid supply unit of a liquid cooling heat dissipation system according to an embodiment of the present application.

The secondary side cooling unit 2 includes a secondary side liquid supply unit 201, a secondary side liquid return unit 203 and a load unit 202, where the secondary side cooling unit 2 drives a circulation flow of the coolant in the line of the secondary side cooling unit 2 using a pump drive unit 204, and continuously and continuously transfers the heat generated by the load unit 202, such as a server and a switch to the heat exchange unit 3 to complete the heat exchange between the secondary side cooling unit 2 and the primary side cooling unit 1. The secondary side liquid supply unit 201 includes a secondary side liquid supply pressure sensor, three secondary side liquid supply temperature sensors 238, a secondary side coolant visual monitoring device 239 and a secondary side liquid supply main line on-off valve 240 connected successively, where the secondary side liquid supply inlet pressure sensor 241 is in communication with the secondary side outlet of the heat exchange unit 3, and the secondary side liquid supply main line on-off valve 240 is in communication with the load unit 202.

The secondary side liquid supply temperature sensor 238 is designed by a solution with one on use and two on standby and is used for reading and outputting temperature of a coolant (a low-temperature coolant) in a line of the secondary side liquid supply unit 201, and outputting the temperature of the coolant collected by the secondary side liquid supply temperature sensor 238 to the control system, such that the control system adjusts the operating state of the secondary side liquid supply unit 201 according to specific requirements of use, referring to the primary side liquid supply temperature sensor 106 for the specific adjustment method. Since different data centers have different grades and different reliability, it is necessary to design the solution of the secondary side liquid supply temperature sensor 238 according to the reliability of a grading machine in the data center, including a solution with one on use and one on standby (low reliability) and a solution with one on use and two on standby (high reliability). The function of the secondary side coolant visual monitoring device 239 is described referring to the primary side coolant visual monitoring device 117. The secondary side liquid supply main line on-off valve 240 is used for achieving the overall on-off between the secondary side liquid supply unit 201 and the load unit 202 to perform a shut-off operation of the liquid supply main line when the relevant components of the secondary side liquid supply unit 201 need to be maintained and the primary side cooling machine pump drive device 102 is integrally migrated, thereby improving the maintenance efficiency. The load unit 202 is composed of relevant liquid cooling products such as a liquid cooling server and a liquid cooling integral cabinet. During operation, the load unit 202 generates a large amount of heat and raises the temperature of the low-temperature coolant provided by the secondary side liquid supply unit 201 to the high-temperature coolant delivered by the secondary side liquid return unit 203 via a cold plate assembly in the liquid cooling products, thereby completing the heat transfer conversion and heat dissipation operations of the liquid cooling products.

In some embodiments, the secondary side liquid supply pressure sensor includes secondary side liquid supply inlet pressure sensors 241 and secondary side liquid supply outlet pressure sensors 242, and a secondary side first liquid supply module 243 and a secondary side second liquid supply module 244 arranged in parallel are connected between the respective secondary side liquid supply inlet pressure sensor 241 and secondary side liquid supply outlet pressure sensor 242; the secondary side first liquid supply module 243 and the secondary side second liquid supply module 244 each include secondary side inlet on-off valves 245, a secondary side drainage and water quality sampling valve 246, a secondary side filter 247 and secondary side outlet on-off valves 248 connected successively, where the secondary side inlet on-off valves 245 are all in communication with the secondary side liquid supply inlet pressure sensors 241, and the secondary side outlet on-off valves 248 are all in communication with the secondary side liquid supply outlet pressure sensors 242. The operating principles of the secondary side first liquid supply module 243 and the secondary side second liquid supply module 244 are consistent with those of the primary side first liquid supply module 110 and the primary side second liquid supply module 111, and reference can be made to the description of the primary side first liquid supply module 110 and the primary side second liquid supply module 111 for the specific operating modes.

Figure 4:
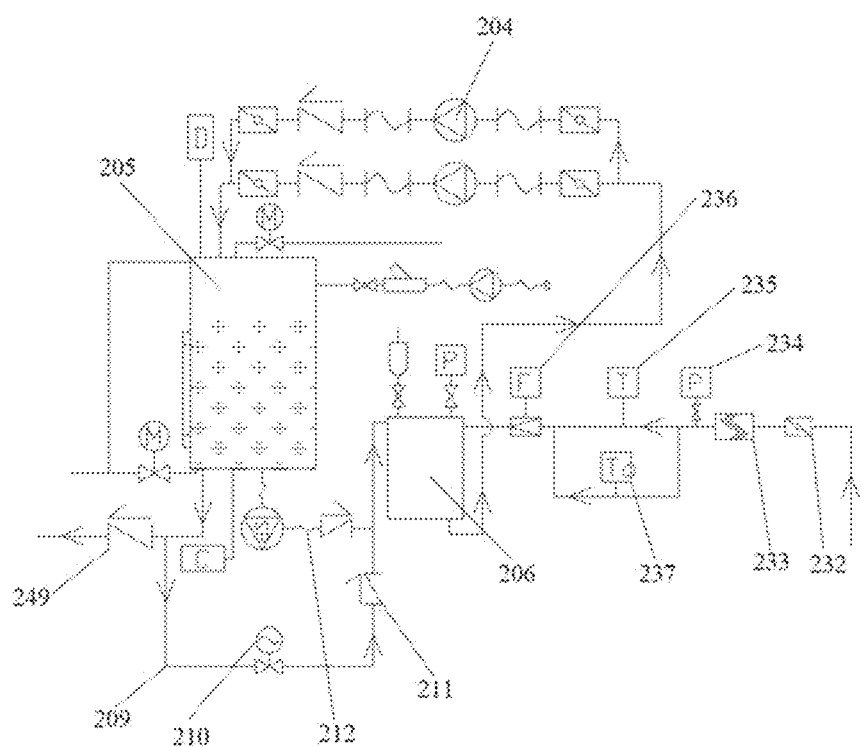
FIG. 4 is a structural diagram showing a secondary side liquid return unit of a liquid cooling heat dissipation system according to an embodiment of the present application.

In some embodiments, as shown in FIG. 4, FIG. 4 is a structural diagram showing a secondary side liquid return unit of a liquid cooling heat dissipation system according to an embodiment of the present application.

The secondary side liquid return unit 203 includes a pump drive unit 204 and a static pressure water tank 205, where the inlet of the pump drive unit 204 is in communication with the outlet of the load unit 202, the outlet of the pump drive unit 204 is in communication with the top of the static pressure water tank 205 which is in communication with the atmosphere, the bottom of the static pressure water tank 205 is provided with a bottom outlet, and the bottom outlet of the static pressure water tank 205 is in communication with the secondary side inlet of the heat exchange unit 3, and the secondary side outlet of the heat exchange unit 3 is in communication with the inlet of the load unit 202, where the pump drive unit 204 is a water pump that pumps water from an inlet side thereof.

Figure 5:
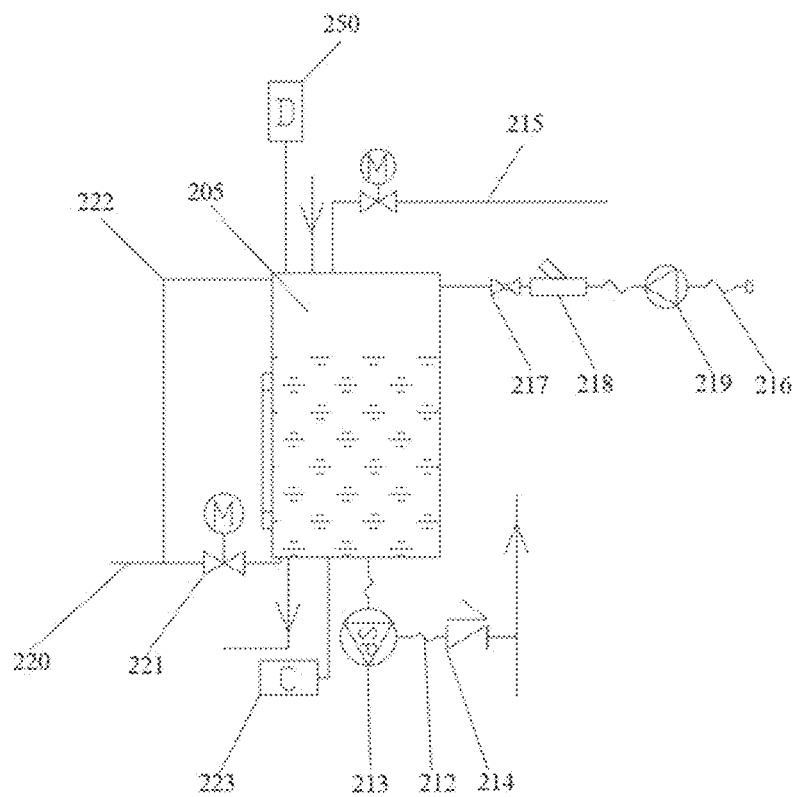
FIG. 5 is a structural diagram showing a static pressure water tank of a liquid cooling heat dissipation system according to an embodiment of the present application.

The secondary side liquid return unit 203 uses the pump drive unit 204 to continuously deliver the secondary side high-temperature coolant which has completed heat exchange with the load unit 202 to the heat exchange unit 3 to complete a cooling operation of the secondary side high-temperature coolant via the heat exchange unit 3, where the pump drive unit 204 provides a driving force for the coolant in the line of the secondary side cooling unit 2, and the pump drive unit 204 includes a secondary side drive pump 228, where the secondary side drive pump 228 is a common water pump, and the secondary side drive pump 228 reduces the pressure at the inlet side thereof; such that the line between the inlet side of the secondary side drive pump 228 and the bottom outlet of the static pressure water tank 205 is in a negative pressure state, thereby forming a negative pressure line; as shown in FIG. 5, the static pressure water tank 205 is in communication with the ambient atmosphere via an atmosphere communication line 250; the pressure of the static pressure water tank 205 is greater than the pressure of the negative pressure line; a pressure difference is formed between the atmospheric pressure and the negative pressure; and the pressure difference establishes a circulation flow power of the coolant of the secondary side cooling unit 2, and therefore the coolant of the static pressure water tank 205 is delivered to the negative pressure line under the action of the circulation flow power. In addition, the atmosphere communication line 250 at the top of the static pressure water tank 205 is used for a pressure relief operation of the static pressure water tank 205, and a dust-proof end cap is provided at the top thereof to prevent foreign particles from entering the interior of the water tank to contaminate the secondary side coolant in the static pressure water tank 205. In addition, a secondary side main line check valve 249 is provided between a bottom outlet of the static pressure water tank 205 and a secondary side inlet of the heat exchange unit 3 to prevent backflow of the high-temperature coolant. The load unit (202) is configured to exchange heat between the low-temperature coolant and the load to form a high-temperature coolant. The pressure difference between the ambient atmospheric pressure and the negative pressure in the negative pressure line makes the negative pressure line always operate in the negative pressure state, which can effectively reduce the leakage of the coolant and improve the safety of the liquid cooling heat dissipation system and data center.

In some embodiments, the secondary side cooling unit 2 includes a secondary side liquid return unit 203, where the secondary side liquid return unit 203 includes an exhaust tank 206, a bottom outlet of the static pressure water tank 205 and the outlet of the load unit 202 are both in communication with top inlets of the exhaust tank 206, the bottom outlet of the exhaust tank 206 is in communication with the inlet of the pump drive unit 204, and a pressure-stabilizing exhaust valve 207 is provided at a top of the exhaust tank 206.

Figure 6:
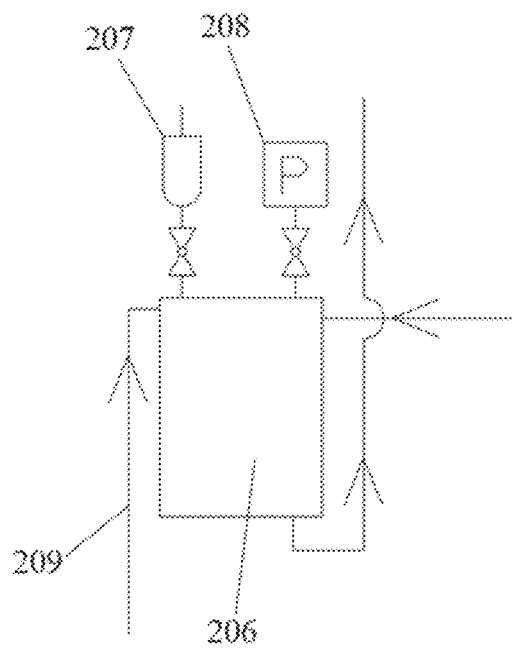
FIG. 6 is a structural diagram showing an exhaust tank of a liquid cooling heat dissipation system according to an embodiment of the present application.

As shown in FIG. 6, there will be mixed gas in the coolant of the secondary side cooling unit 2, when there is mixed gas in a line between the bottom outlet of the static pressure water tank 205 and the top inlet of the exhaust tank 206, the coolant in the line between the bottom outlet of the static pressure water tank 205 and the top inlet of the exhaust tank 206 flows into the exhaust tank 206, and the mixed gas will also enter the interior of the exhaust tank 206 and be discharged through the pressure-stabilizing exhaust valve 207; when the secondary side high-temperature coolant produced by the heat exchange of the load unit 202 is mixed with gas, the secondary side high-temperature coolant produced by the heat exchange of the load unit 202 enters the exhaust tank 206, and the mixed gas also enters the interior of the exhaust tank 206 and is discharged through the pressure-stabilizing exhaust valve 207 to avoid the problems of excessive noise vibration, line damage and water pump blade cavitation damage caused by the gas in the line. The secondary side coolant (a high-temperature coolant), which is deaerated in the exhaust tank, enters an outflow line connected to the bottom outlet of the exhaust tank under the action of the secondary side drive pump 228 and circulates in the circulation line of the secondary side cooling unit 2.

In some embodiments, exhaust pressure-stabilizing pressure sensors 208 are further provided at the top of the exhaust tank 206 and are all in communication with the interior of the exhaust tank 206, the bottom outlet of the static pressure water tank 205 is in communication with the top inlet of the exhaust tank 206 via a secondary side bypass liquid return line 209, and a secondary side bypass regulating unit 210 and a secondary side bypass check valve 211 are provided on the secondary side bypass liquid return line 209.

The secondary side high-temperature coolant that flows through the load unit 202 and performs heat exchange, and the secondary side high-temperature coolant that flows through the secondary side bypass liquid return line 209 enters the interior of the secondary side exhaust tank from the top inlet of the exhaust tank. The exhaust pressure-stabilizing pressure sensor 208 is used for collecting the air pressure in the interior of the exhaust tank 206, and when the air pressure in the interior of the exhaust tank 206 is lower than a threshold value, it is indicated that there is less coolant in the interior of the exhaust tank 206, and at this time, the flow of the coolant entering the exhaust tank 206 can be adjusted, such as increasing the rotation speed of the secondary side drive pump 228, and/or increasing the flow of the coolant flowing into the exhaust tank 206 via the secondary side bypass liquid return line 209 to increase the air pressure in the interior of the exhaust tank 206; when the air pressure in the exhaust tank 206 is higher than the threshold value, it is indicated that there is more coolant in the exhaust tank 206. At this time, the flow of the coolant entering the exhaust tank 206 can be adjusted, for example, by reducing the rotation speed of the secondary side drive pump 228, and/or by reducing the flow of the coolant flowing into the exhaust tank 206 via the secondary side bypass liquid return line 209 to reduce the air pressure in the exhaust tank 206. Therefore, the bypass flow can be adjusted by automatically adjusting the valve opening degree of the secondary side bypass regulating unit 210 according to actual needs. Further, the flow of the coolant entering the exhaust tank 206 through the secondary side bypass liquid return line 209 is adjusted by adjusting the valve opening degree via a secondary side bypass regulating unit 210 on the secondary side bypass liquid return line 209. The secondary side bypass liquid return line 209 is further provided with a secondary side bypass check valve 211 for preventing the coolant from flowing back. In addition, when the desired amount of the coolant of the load unit 202 is lower than the minimum flow delivered by the pump drive unit 204, the opening degree of the secondary side bypass regulating unit 210 of the secondary side liquid return bypass line is adjusted to be large, such that the coolant flowing to the static pressure water tank 205 via the pump drive unit 204 flows directly back to the inlet side of the pump drive unit 204 via the exhaust tank 206, which is equivalent to connecting the liquid outlet of the pump drive unit 204 with the liquid inlet to return the coolant which is more than the desired amount of the coolant of the load unit 202 to the pump drive unit 204 to avoid the waste of the coolant caused by the overflow of the coolant which is more than the desired amount of the coolant of the load unit 202 via the static pressure water tank 205.

In some embodiments, a system liquid supply line 212 is provided between a bottom of the static pressure water tank 205 and the top inlet of the exhaust tank 206, and a secondary side system liquid supply pump 213 and a secondary side system liquid supply check valve 214 are provided on the system liquid supply line 212.

The system liquid supply line 212 is composed of the secondary side system liquid supply pump 213 and the secondary side system liquid supply check valve 214 and related lines. For example, as a total number of servers in the data center increases, the number of the load unit 202 increases, the amount of the required coolant increases, the coolant in the static pressure water tank 205 can be supplied into a line of the secondary side cooling unit 2 by the secondary side system liquid supply pump 213 to meet a demand of the load side for the coolant. The secondary side system liquid supply check valve 214 prevents backflow of the coolant into the line. In addition, a coolant branch is established in parallel between the load unit 202 and the secondary side liquid return main line on-off valve 232, an on-off valve is provided at two ends of the branch, and the branch is used for, when the total number of servers increases, mounting a coolant radiating line for a newly added server load in a state where the liquid cooling heat dissipation system does not stopping operating, and at this time, a desired amount of the coolant needs to be increased; an operator sets the newly added number of server loads in the control system; and the control system receives the number of servers set by the user, and automatically calculates the desired amount of the coolant required by the newly added server. The control system liquid supply line 212 then supplies the exhaust tank 206 with the desired amount of coolant, increasing the operation efficiency of the operator, and adding a new heat dissipation line to the server load without stopping the machine.

In some embodiments, an automatic water tank liquid supply line 215 and a manual water tank liquid supply line 216 are connected to a top of the static pressure water tank 205, where the manual water tank liquid supply line 216 includes a manual secondary side liquid supply on-off valve 217, a secondary side liquid supply filter 218 and a secondary side water tank liquid supply pump 219 which are in communication successively, the manual secondary side liquid supply on-off valve 217 is in communication with the top of the static pressure water tank 205, and the secondary side water tank liquid supply pump 219 is in communication with a liquid supply water tank; the automatic water tank liquid supply line 215 has one end in communication with the top of the static pressure water tank 205 and the other end in communication with a pressurized coolant delivery line.

A long-time operation of the liquid cooling heat dissipation system will lead to a decrease in the amount of coolant, so it is necessary to periodically supply the coolant in the static pressure water tank 205, and the liquid supply of the coolant includes two methods of an automatic liquid supply method and a manual liquid supply method. The manual liquid supply method includes a manual water tank liquid supply line 216 composed of a manual secondary side liquid supply on-off valve 217, a secondary side liquid supply filter 218, a secondary side water tank liquid supply pump 219 and a water supply water tank, the manual water tank liquid supply line 216 has one end connected to the top of the static pressure water tank 205 and the other end connected to the water supply water tank, and the water supply water tank is an external non-pressure secondary side coolant container; when the static pressure water tank 205 needs to be manually supplied, an operator manually opens the manual secondary side liquid supply on-off valve 217 and activates the secondary side tank liquid supply pump 219 for liquid supply operations. At the same time, the secondary side liquid supply filter 218 is capable of filtering and cleaning the liquid supply coolant to prevent impurities in the coolant from entering the interior of the pump drive heat exchange system. The automatic liquid supply method includes an automatic water tank liquid supply line 215 having one end connected to the static pressure water tank 205 to obtain a top and the other end connected to an external pressurized secondary side coolant delivery line, and mounted a solenoid on-off valve thereon; when the static pressure water tank 205 outputs the liquid supply demand, the solenoid valve thereof is automatically turned on, and the secondary side coolant will be automatically delivered to the interior of the water tank by the external pressurized secondary side coolant delivery line, and when the liquid supply is completed, the solenoid valve is automatically turned off.

In some embodiments, a drain line 220 is connected to the bottom of the static pressure water tank 205, a solenoid valve 221 is provided on the drain line 220, an overflow line 222 is connected to the top of the static pressure water tank 205 to be in communication with the drain line 220.

When the coolant in the static pressure water tank 205 exceeds the volume of the static pressure water tank 205 due to serious blockage of the liquid cooling heat dissipation system, the coolant exceeding the volume of the static pressure water tank 205 needs to be discharged, and therefore an overflow line 222 needs to be provided at the top of the static pressure water tank 205, and the coolant exceeding the volume of the static pressure water tank 205 is discharged through the overflow line 222. Further, when it is required to discharge the coolant in the static pressure water tank 205, the coolant in a pressure-reducing tank is discharged through the bottom of the static pressure water tank 205, and therefore a drain line 220 is provided at the bottom of the static pressure water tank 205, and a solenoid valve 221 is provided on the drain line 220, and the coolant in the static pressure water tank 205 is discharged through the solenoid valve 221. Meanwhile, the overflow line 222 may be directly communicated with the drain line 220 through which the overflowed coolant is directly discharged, and the overflow line 222 is connected to the drain line 220 at the outlet side of the solenoid valve 221. The overflow line 222 is used for the safe overflow of the static pressure water tank 205 to avoid the system failure caused by excessive water amount, and improve the safety of the liquid cooling heat dissipation system.

In some embodiments, an automatic secondary side water quality detection monitoring unit 223 is connected to the bottom of the static pressure water tank 205 and is configured to detect a water quality state of a secondary side coolant.

An automatic secondary side water quality detection monitoring unit 223 is connected to the bottom of the static pressure water tank 205 for detecting water quality states, such as turbidity, conductivity, pH and particle size of the coolant in the secondary side cooling unit 2; and a corresponding sensor is built therein to complete relevant water quality detection operation to improve the water quality of the coolant.

In some embodiments, the pump drive unit 204 includes a first pump drive unit 224 and a second pump drive unit 225 arranged in parallel, and the first pump drive unit 224 and the second pump drive unit 225 each include a secondary side liquid return inlet on-off valve 226, a secondary side drive pump 228 inlet shock-absorbing pipe 227, a secondary side drive pump, a secondary side drive pump outlet shock-absorbing pipe 229, a secondary side liquid return check valve 230 and a secondary side liquid return outlet on-off valve 231 which are in communication successively, where the secondary side liquid return inlet on-off valve 226 is in communication with the bottom outlet of the exhaust tank 206, and the secondary side liquid return outlet on-off valve 231 is in communication with the top of the static pressure water tank 205.

Figure 7:
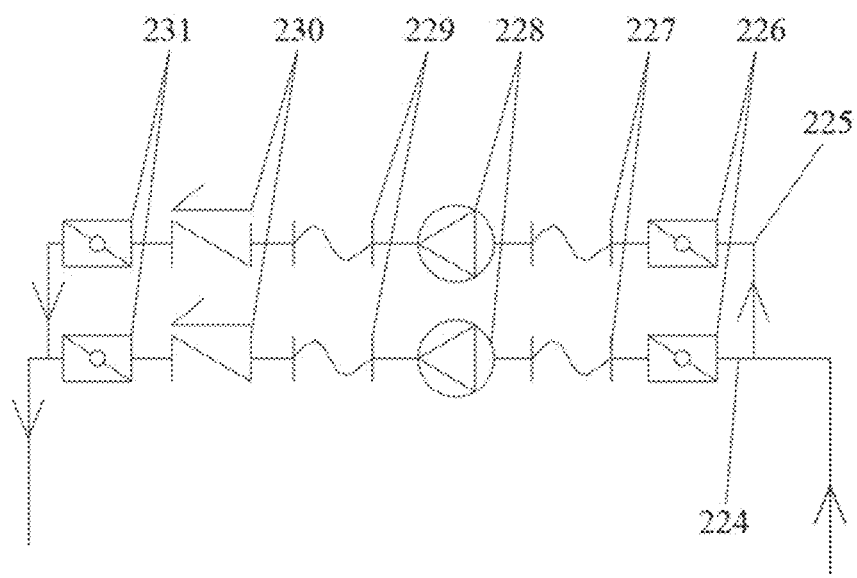
FIG. 7 is a structural diagram showing a pump drive unit of a liquid cooling heat dissipation system according to an embodiment of the present application.

As shown in FIG. 7, the pump drive unit 204 includes a first pump drive unit 224 and a second pump drive unit 225 arranged in parallel. The first pump drive unit 224 and the second pump drive unit 225 are both respectively composed of a secondary side liquid return inlet on-off valve 226, a secondary side drive pump inlet shock-absorbing pipe 227, a secondary side drive pump 228, a secondary side drive pump outlet shock-absorbing pipe 229, a secondary side liquid return check valve 230, and a secondary side liquid return outlet on-off valve 231. The first pump drive unit 224 and the second pump drive unit 225 provide a driving force for the circulation flow of the coolant of the secondary side cooling unit 2 using the secondary side drive pump 228. The pump drive unit 204 adopts a design of dual-pump alternating operation with one on use and one on standby, on one hand, it is used for ensuring that when one of the pump drive units fails to operate and needs to be shut down for maintenance, it would not affect the normal operation of the system; on the other hand, it can avoid the problems of motor overheating, thermal attenuation, efficiency reduction and service life reduction caused by long-time operation, and effectively improve the service life and operation efficiency of the pump drive unit 204. The secondary side drive pump inlet shock-absorbing pipe 227 and the secondary side drive pump outlet shock-absorbing pipe 229 are used for eliminating a mounting error when the secondary side drive pump 228 interfaces with the line and to reduce the shock impact when the secondary side drive pump 228 operates. The secondary side liquid return check valve 230 serves to prevent the drive pump from dropping in driving force and the coolant in the static pressure water tank 205 from being sucked back due to the return flow of the secondary side coolant outputted from the secondary side drive pump 228. The secondary side coolant inlet on-off valve and the secondary side coolant outlet on-off valve cooperate to realize an overall on-off of the line of the pump drive unit 204, and cooperate to realize the maintenance of the relevant components of the pump drive unit 204 under the non-stop operation state of the liquid cooling heat dissipation system.

In some embodiments, a secondary side liquid return main line on-off valve 232, a secondary side ultraviolet sterilization device 233, a secondary side liquid return pressure sensor 234, a secondary side liquid return temperature sensor 235 and a secondary side liquid return flow sensor 236 are connected successively between the load unit 202 and the top of the exhaust tank 206, the secondary side liquid return flow sensor 236 being in communication with the top of the exhaust tank 206, and the secondary side liquid return main line on-off valve 232 being in communication with the load unit 202.

The secondary side liquid return main line on-off valve 232 is used for achieving the overall on-off between the secondary side liquid return unit 203 and the load unit 202 to perform a shut-off operation of the liquid return main line when the relevant components of the secondary side liquid return unit 203 need to be maintained and the primary side cooling machine pump drive device 102 is integrally migrated. The secondary side ultraviolet sterilization device 233 achieves active disinfection and killing of the microbial bacteria in the coolant of the secondary side cooling unit 2 using the ultraviolet sterilization technology to prevent the water quality of the coolant polluting the coolant circulation line caused by the microbial bacteria exceeding the standard in the coolant of the secondary side cooling unit 2, or the corrosion damage of the liquid cooling server, etc. The secondary side liquid return pressure sensor 234 is used for reading and outputting the liquid return pressure of the secondary side liquid return unit 203 and the pressure at the outlet side of the load unit 202, and outputting the liquid return pressure of the secondary side liquid return unit 203 to the control system, and the control system compares this pressure value with the pressure at the inlet side of the load unit 202 measured by the secondary side liquid supply outlet pressure sensor 242, and if the pressure difference between the two is relatively large, it is indicated that there may be a blockage at the load unit 202; in addition, the control system determines a magnitude of a liquid return pressure value of the secondary side liquid return unit 203, and if the liquid return pressure value of the secondary side liquid return unit 203 is relatively large, the power of the secondary side drive pump 228 needs to be adjusted to further reduce the negative pressure in the negative pressure line, that is to further increase the pressure difference between the atmospheric pressure and the negative pressure, and the increased pressure difference improves the drive capability of the coolant in the secondary side cooling unit 2.

In some embodiments, a secondary side leakage detecting device 237 is connected in parallel between the secondary side liquid return pressure sensor 234 and the secondary side liquid return flow sensor 236.

The secondary side leakage detecting device 237 achieves the function of real-time detection of leakage and line damage of the secondary side cooling unit 2 using a liquid bubble detector. When the line is damaged, since the interior of the line of the secondary side cooling unit 2 is in a negative pressure state, a large amount of outside air will enter the line through the damaged part of the line, and at this time, the liquid bubble detector in the secondary side leakage detecting device 237 will be able to quickly detect the information about the line damage and output same to the control system. The control system will then perform the relevant processing operations according to the actual situation. Since the secondary side leakage detecting device 237 needs a specified coolant pressure when performing leakage detection, the secondary side leakage detecting device 237 is connected in parallel to the liquid return line, such that the coolant pressure in the line where the secondary side leakage detecting device 237 is located is within a specified value.

In some embodiments, the liquid cooling heat dissipation system further includes an external pipe leakage detecting device, where the external pipe leakage detecting device includes a resistance sensor.

Since the primary side cooling unit 1 of the liquid cooling heat dissipation system is still a positive pressure system, an external pipe leakage detecting device is arranged at a position where leakage easily occurs outside the pipe of the primary side cooling unit 1, for example, a resistance sensor is used for sensing whether or not leakage occurs in the pipe. In addition, a negative pressure system is used for the secondary side cooling unit 2, but if the secondary side cooling unit 2 has a serious leakage, if the breakage is large, the coolant will leak. Therefore, an external pipe leakage detecting device is arranged at a position where the secondary side cooling unit 2 is likely to leak liquid, and the leakage detection capability is improved by combining the secondary side leakage detecting device 237 with the external pipe leakage detecting device to further improve the safety of the liquid cooling heat dissipation system.

In some embodiments, the primary side cooling machine pump drive device 102 includes an outdoor cooling machine, a primary side coolant drive pump, a constant-pressure water supply device, and an automatic dosing device.

The primary side cooling machine pump drive device 102 is composed of an outdoor cooling machine, a primary side coolant drive pump, a constant-pressure water supply device and an automatic dosing device, and the primary side cooling machine pump drive device 102 is used for cooling the coolant of the primary side cooling unit 1 and circulating the coolant. The outdoor cooling machine completes the cooling operation of the coolant of the primary side cooling unit 1 by using technologies such as a compressor, evaporation and heat dissipation. The primary side coolant drive pump provides flow power to the coolant of the primary side cooling unit 1, thereby realizing the circulation flow of the coolant of the primary side cooling unit 1.

Figure 8:
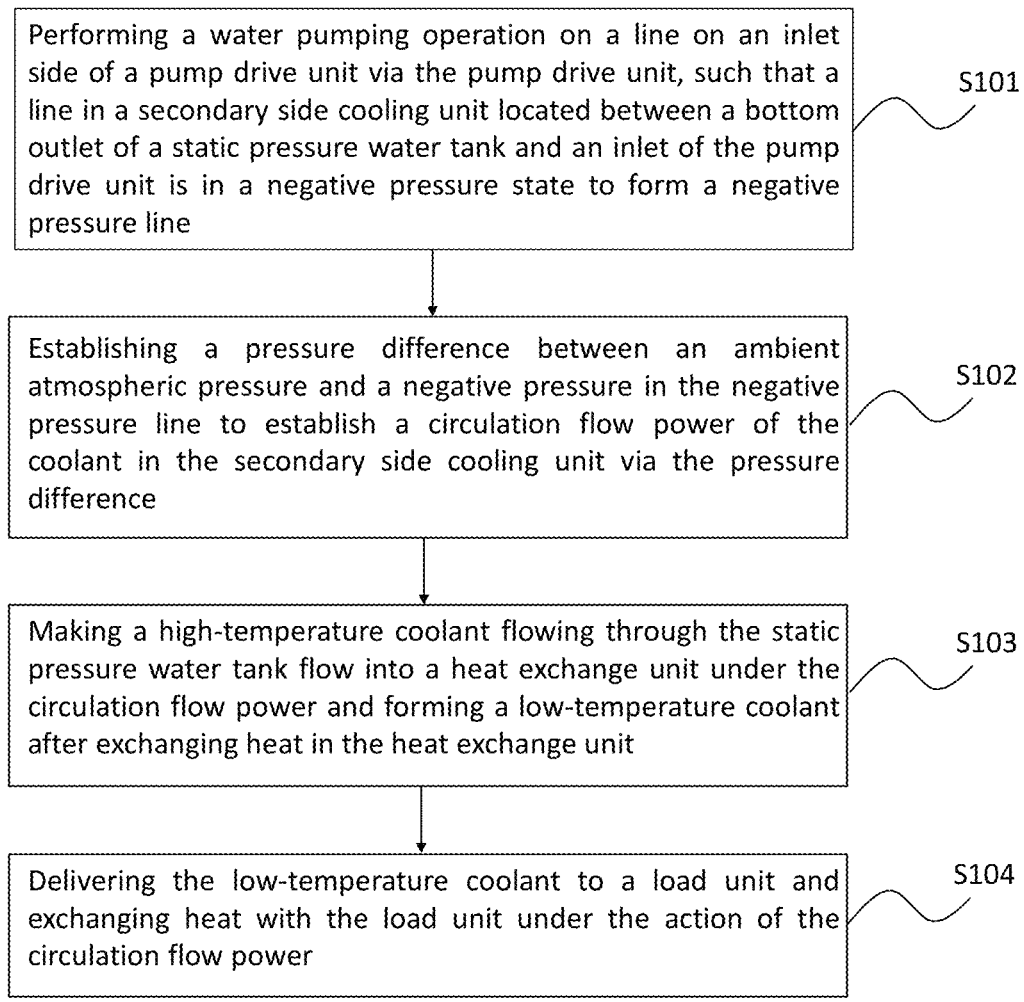
FIG. 8 is a method flow diagram showing a liquid cooling heat dissipation method according to an embodiment of the present application.

In some embodiments, referring to FIGS. 4 and 8, FIG. 4 is a structural diagram showing a secondary side liquid return unit of a liquid cooling heat dissipation system according to an embodiment of the present application, and FIG. 8 is a method flow diagram showing a liquid cooling heat dissipation method according to an embodiment of the present application.

The liquid cooling heat dissipation method includes:
S101 Performing a water pumping operation on a line on an inlet side of the pump drive unit 204 via the pump drive unit 204, such that a line in a secondary side cooling unit 2 located between a bottom outlet of a static pressure water tank 205 and an inlet of the pump drive unit 204 is in a negative pressure state to form a negative pressure line;
S102 Establishing a pressure difference between an ambient atmospheric pressure and a negative pressure in the negative pressure line to establish a circulation flow power of the coolant in the secondary side cooling unit 2 via the pressure difference;
S103 Making a high-temperature coolant flowing through the static pressure water tank 205 flow into a heat exchange unit 3 under the circulation flow power and forming a low-temperature coolant after exchanging heat in the heat exchange unit 3; and
S104 Delivering the low-temperature coolant to a load unit 202 and exchanging heat with a load under the action of the circulation flow power.

The pump drive unit 204 in the present application performs a water pumping operation on the line at the inlet side of the pump drive unit 204, such that the line between the bottom outlet of the static pressure water tank 205 and the inlet of the pump drive unit 204 is in a negative pressure state, and therefore the line between the bottom outlet of the static pressure water tank 205 and the inlet of the pump drive unit 204 forms a negative pressure line; the coolant is stored in the static pressure water tank 205 to be in communication with the ambient atmosphere, such that a pressure difference is generated between the ambient atmospheric pressure and the negative pressure of the negative pressure line, and the ambient atmospheric pressure is greater than the pressure of the negative pressure line, such that the pressure difference generated between the ambient atmospheric pressure and the negative pressure of the negative pressure line establishes a circulation flow power of the coolant in the secondary side cooling unit 2. The high-temperature coolant in the static pressure water tank 205 is delivered to the heat exchange unit 3 under the circulation flow power; the high-temperature coolant exchanges heat in the heat exchange unit 3 to form a low-temperature coolant; the low-temperature coolant is delivered to the load unit 202 under the circulation flow power; and the low-temperature coolant exchanges heat with the load in the load unit 202 to cool the load.

The pressure difference between the ambient atmospheric pressure and the negative pressure in the negative pressure line makes the negative pressure line always operate in the negative pressure state, which can effectively reduce the leakage of the coolant and improve the safety of the liquid cooling heat dissipation system and data center.

In some embodiments, the method further includes:
after the load unit 202 performs heat exchange, the low-temperature coolant forms a high-temperature coolant;
the high-temperature coolant is delivered by the circulation flow power through the pump drive unit 204 and to the static pressure water tank 205.

The low-temperature coolant forms a high-temperature coolant after exchanging heat between the load unit 202 and the load, and then the high-temperature coolant is delivered to the pump drive unit 204 under a circulation flow power; the high-temperature coolant at the outlet side of the pump drive unit 204 is a pressurized coolant, and the pressure of the pressurized coolant is greater than atmospheric pressure; therefore, the pressurized coolant further flows to the static pressure water tank 205, and the pressurized coolant is relieved in the static pressure water tank 205 to realize reciprocating circulation of the coolant in the secondary side cooling unit 2.

In some embodiments, the method further includes:
a temperature feedback mechanism is established by a temperature value of the secondary side liquid return temperature sensor 235 and a preset temperature value and the pump drive unit 204;
in response to the temperature value of the secondary side liquid return temperature sensor 235 being higher than the preset temperature value, the pumping power of the pump drive unit 204 is increased to reduce the negative pressure of the negative pressure line; and
the circulation flow power is increased by increasing the pressure difference to increase the flow in the lien of the secondary side cooling unit 2, such that the temperature value of the secondary side liquid return temperature sensor 235 is lower than the preset temperature value.

The secondary side liquid return temperature sensor 235 can monitor the temperature of the high-temperature coolant in the line of the secondary side liquid return unit 203 in real time, and a temperature feedback mechanism is established by the secondary side liquid return temperature sensor 235, the preset temperature value and the pump drive unit 204 to improve the control capability and safety of the control system. The specific operating principle is as follows: the temperature of the high-temperature coolant in the line of the secondary side liquid return unit 203 is monitored in real time, and the temperature of the high-temperature coolant in the line of the secondary side liquid return unit 203 is compared with a preset temperature value; if the temperature of the high-temperature coolant in the line of the secondary side liquid return unit 203 is higher than the preset temperature value (a high threshold value), the water pumping power of the pump drive unit 204 is increased to further reduce the negative pressure in the negative pressure line; at this time, the pressure difference formed by the ambient atmospheric pressure and the negative pressure in the negative pressure line will increase; and the circulation flow power is increased by the increased pressure difference to further increase the flow in the line of the secondary side cooling unit 2 until the temperature value of the secondary side liquid return temperature sensor 235 is lower than the preset temperature value, a power-up operation of the pump drive unit 204 is discontinued; if the temperature of the high-temperature coolant in the line of the secondary side liquid return unit 203 is lower than the preset temperature value (a low threshold value), the water pumping power of the pump drive unit 204 is reduced to further increase the negative pressure in the negative pressure line, and at this time, the value of the pressure difference formed by the ambient atmospheric pressure and the negative pressure in the negative pressure line will be reduced; the circulation flow power is reduced by the reduced pressure difference to further reduce the flow in the line of the secondary side cooling unit 2, until the temperature value of the secondary side liquid return temperature sensor 235 is higher than the preset temperature value, and a power-down operation of the pump drive unit 204 is discontinued. Further, the flow, the temperature and the pressure are in an interlocking relationship, and increasing the power of the pump drive unit 204 will increase the flow in the line, and will correspondingly increase the pressure and reduce the temperature. In addition, a feedback mechanism can also be established through the temperature data collected by the secondary side liquid supply temperature sensor 238 according to the same specific operating principle.

In some embodiments, the method further includes:
a valve opening degree of the secondary side bypass regulating unit 210 is adjusted, such that a flow of an outlet side of the pump drive unit 204 exceeding a desired amount of the coolant of the load unit 202 flows to an exhaust tank 206 and returns to the inlet side of the pump drive unit 204, in response to the desired amount of the coolant of the load unit 202 being lower than a minimum flow of the outlet side of the pump drive unit 204.

If the desired amount of the coolant by the load unit 202 is lower than the minimum flow at the outlet side of the pump drive unit 204, it is indicated that the load of the load unit 202 is reduced, for example, there are ten servers before, and there is one server now; however, the desired amount of the coolant of the load unit 202 is lower than the minimum flow at the outlet side of the pump drive unit 204; at this time, the valve opening degree of the secondary side bypass regulating unit 210 is adjusted, and the opening degree of the secondary side bypass regulating unit 210 of the secondary side liquid return bypass line is increased, such that the coolant flowing to the static pressure water tank 205 via the pump drive unit 204 flows directly back to the inlet side of the pump drive unit 204 via the exhaust tank 206, which is equivalent to connecting the liquid outlet of the pump drive unit 204 with the liquid inlet to return the coolant which is more than the desired amount of the coolant of the load unit 202 to the pump drive unit 204 to avoid the waste of the coolant caused by the overflow of the coolant which is more than the desired amount of the coolant of the load unit 202 via the static pressure water tank 205.

It should be understood that, although the various steps in the flow diagram of FIG. 8 are shown sequentially as indicated by the arrows, these steps are not necessarily performed sequentially in the order indicated by the arrows. The steps are performed in no strict order unless explicitly stated herein, and the steps may be performed in other orders. Further, at least a portion of the steps in FIG. 8 may include multiple sub-steps or phases, which are not necessarily executed simultaneously but may be carried out at different timings. The execution sequence of these sub-steps or phases is not necessarily consecutive and may alternate or interleave with at least some of the sub-steps or phases of other steps.

The embodiments described above represent only a few embodiments of the present application and are described in more detail and are not to be construed as limiting the scope of the present application. It should be noted that several variations and modifications can be made by a person skilled in the art without departing from the inventive concept, which is within the scope of the present application. Accordingly, the protection sought in the present application is as set forth in the claims below.

What is claimed is:

1. A liquid cooling heat dissipation system, comprising a primary side cooling unit, a secondary side cooling unit and a heat exchange unit, wherein an outlet of the primary side cooling unit is in communication with a primary side inlet of the heat exchange unit, and a primary side outlet of the heat exchange unit is in communication with an inlet of the primary side cooling unit; and the secondary side cooling unit comprises a pump drive unit, a static pressure water tank and a load unit, wherein an inlet of the pump drive unit is in communication with an outlet of the load unit, an outlet of the pump drive unit is in communication with the static pressure water tank, the static pressure water tank is in communication with the atmosphere and is also in communication with a secondary side inlet of the heat exchange unit, a secondary side outlet of the heat exchange unit is in communication with an inlet of the load unit, and the pump drive unit is a water pump for pumping water to an inlet side of the pump drive unit;

wherein the secondary side cooling unit comprises a secondary side liquid return unit, wherein the secondary side liquid return unit comprises an exhaust tank, a bottom outlet of the static pressure water tank and the outlet of the load unit are both in communication with a top inlet of the exhaust tank, a bottom outlet of the exhaust tank is in communication with the inlet of the pump drive unit, and a pressure-stabilizing exhaust valve is provided at a top of the exhaust tank.

2. The liquid cooling heat dissipation system according to claim 1, wherein exhaust pressure-stabilizing pressure sensors are further provided at the top of the exhaust tank and are all in communication with an interior of the exhaust tank, the bottom outlet of the static pressure water tank is in communication with the top inlet of the exhaust tank via a secondary side bypass liquid return line, and a secondary side bypass regulating unit and a secondary side bypass check valve are provided on the secondary side bypass liquid return line.

3. The liquid cooling heat dissipation system according to claim 1, wherein a system liquid supply line is provided between a bottom of the static pressure water tank and the top inlet of the exhaust tank, and a secondary side system liquid supply pump and a secondary side system liquid supply check valve are provided on the system liquid supply line.

4. The liquid cooling heat dissipation system according to claim 1, wherein an automatic water tank liquid supply line and a manual water tank liquid supply line are connected to a top of the static pressure water tank, wherein the manual water tank liquid supply line comprises a manual secondary side liquid supply on-off valve, a secondary side liquid supply filter and a secondary side water tank liquid supply pump which are in communication successively, the manual secondary side liquid supply on-off valve is in communication with the top of the static pressure water tank, and the secondary side water tank liquid supply pump is in communication with a liquid supply water tank; the automatic water tank liquid supply line has one end in communication with the top of the static pressure water tank and the other end in communication with a pressurized coolant delivery line.

5. The liquid cooling heat dissipation system according to claim 1, wherein a drain line is connected to a bottom of the static pressure water tank and is provided with a solenoid valve, and an overflow line is connected to a top of the static pressure water tank and is in communication with the drain line.

6. The liquid cooling heat dissipation system according to claim 1, wherein an automatic secondary side water quality detection monitoring unit is connected to a bottom of the static pressure water tank and is configured to detect a water quality state of a secondary side coolant.

7. The liquid cooling heat dissipation system according to claim 1, wherein the pump drive unit comprises a first pump drive unit and a second pump drive unit arranged in parallel, and the first pump drive unit and the second pump drive unit each comprise a secondary side liquid return inlet on-off valve, a secondary side drive pump inlet shock-absorbing pipe, a secondary side drive pump, a secondary side drive pump outlet shock-absorbing pipe, a secondary side liquid return check valve and a secondary side liquid return outlet on-off valve which are in communication successively, wherein the secondary side liquid return inlet on-off valve is in communication with the bottom outlet of the exhaust tank, and the secondary side liquid return outlet on-off valve is in communication with a top of the static pressure water tank.

8. The liquid cooling heat dissipation system according to claim 1, wherein a secondary side liquid return main line on-off valve, a secondary side liquid return pressure sensor, a secondary side liquid return temperature sensor and a secondary side liquid return flow sensor are connected successively between the load unit and the top of the exhaust tank, the secondary side liquid return flow sensor being in communication with the top of the exhaust tank, and the secondary side liquid return main line on-off valve being in communication with the load unit.

9. The liquid cooling heat dissipation system according to claim 8, wherein a secondary side leakage detecting device is connected in parallel between the secondary side liquid return pressure sensor and the secondary side liquid return flow sensor, and the secondary side leakage detecting device is a liquid bubble detector.

10. The liquid cooling heat dissipation system according to claim 1, wherein the secondary side cooling unit comprises a secondary side liquid supply unit, the secondary side liquid supply unit comprising a secondary side liquid supply pressure sensor, three secondary side liquid supply temperature sensors, a secondary side coolant visual monitoring device and a secondary side liquid supply main line on-off valve connected successively, the secondary side liquid supply pressure sensor being in communication with the secondary side outlet of the heat exchange unit, and the secondary side liquid supply main line on-off valve being in communication with the load unit.

11. The liquid cooling heat dissipation system according to claim 10, wherein the secondary side liquid supply pressure sensor comprises a secondary side liquid supply inlet pressure sensor and a secondary side liquid supply outlet pressure sensor, and a secondary side first liquid supply module and a secondary side second liquid supply module arranged in parallel are connected between the respective secondary side liquid supply inlet pressure sensor and secondary side liquid supply outlet pressure sensor; the secondary side first liquid supply module and the secondary side second liquid supply module each comprise secondary side inlet on-off valves, a secondary side drainage and water quality sampling valve, a secondary side filter and secondary side outlet on-off valves connected successively, wherein the secondary side inlet on-off valves are all in communication with the secondary side liquid supply inlet pressure sensor, and the secondary side outlet on-off valves are all in communication with the secondary side liquid supply outlet pressure sensor.

12. The liquid cooling heat dissipation system according to claim 1, wherein the primary side cooling unit comprises a primary side liquid supply unit and a primary side cooling machine pump drive device, and the primary side liquid supply unit comprises a primary side liquid supply main line on-off valve, a primary side liquid supply temperature sensor, a primary side liquid supply pressure sensor, and an automatic primary side liquid supply exhaust valve connected successively, the primary side liquid supply main line on-off valve is in communication with an outlet of the primary side cooling machine pump drive device, and the automatic primary side liquid supply exhaust valve is in communication with the primary side inlet of the heat exchange unit.

13. The liquid cooling heat dissipation system according to claim 12, wherein the primary side liquid supply pressure sensor comprises a primary side inlet pressure sensor and a primary side outlet pressure sensor, and a primary side first liquid supply module and a primary side second liquid supply module arranged in parallel are connected between the respective primary side inlet pressure sensor and primary side outlet pressure sensor; the primary side first liquid supply module and the primary side second liquid supply module each comprise primary side inlet on-off valves, a primary side drainage and water quality sampling valve, a primary side filter and primary side outlet on-off valves connected successively, wherein the primary side inlet on-off valves are all in communication with the primary side inlet pressure sensor, and the primary side outlet on-off valves are all in communication with the primary side outlet pressure sensor.

14. The liquid cooling heat dissipation system according to claim 12, wherein the primary side cooling unit comprises a primary side liquid return unit, wherein the primary side liquid return unit comprises a primary side liquid return main line on-off valve, a primary side coolant visual monitoring device, a primary side coolant flow sensor, a primary side liquid return temperature sensor, a primary side liquid return pressure sensor and a primary side coolant regulating device connected successively, the primary side liquid return main line on-off valve is in communication with an inlet of the primary side cooling machine pump drive device, and the primary side coolant regulating device is in communication with the primary side outlet of the heat exchange unit.

15. The liquid cooling heat dissipation system according to claim 1, further comprising an external pipe leakage detecting device, wherein the external pipe leakage detecting device comprises a resistance sensor.

16. A liquid cooling heat dissipation system, comprising:
a pump drive unit configured to perform a water pumping operation on a line on an inlet side of the pump drive unit, such that a line flowing from a static pressure water tank to the pump drive unit in a secondary side cooling unit is in a negative pressure state to form a negative pressure line;
a static pressure water tank in communication with ambient atmospheric pressure and configured to establish a pressure difference between the ambient atmospheric pressure and the negative pressure in the negative pressure line to establish a circulation flow power of the coolant in the secondary side cooling unit via the pressure difference; and
a load unit configured to deliver a low-temperature coolant to a load and performing heat exchange with the load under the circulation flow power to form a high-temperature coolant;
wherein the secondary side cooling unit comprises a secondary side liquid return unit, wherein the secondary side liquid return unit comprises an exhaust tank, a bottom outlet of the static pressure water tank and the outlet of the load unit are both in communication with a top inlet of the exhaust tank, a bottom outlet of the exhaust tank is in communication with the inlet of the pump drive unit, and a pressure-stabilizing exhaust valve is provided at a top of the exhaust tank.

17. The liquid cooling heat dissipation system according to claim 16, further comprising:
a secondary side liquid return temperature sensor configured to collect a temperature value of a secondary side liquid return unit, and establishing a temperature feedback mechanism via the collected temperature value, a first preset temperature value and the pump drive unit, and in response to the temperature value collected by the secondary side liquid return temperature sensor being higher than the first preset temperature value, increasing pumping power of the pump drive unit to reduce the negative pressure of the negative pressure line; and increasing the circulation flow power by increasing the pressure difference to further increase a flow in the secondary side cooling unit pipe, such that the temperature value of the secondary side liquid return temperature sensor is lower than the first preset temperature value.

18. The liquid cooling heat dissipation system according to claim 16, further comprising:
a secondary side bypass regulating unit configured to adjust a valve opening degree of the secondary side bypass regulating unit, such that a flow of an outlet side of the pump drive unit exceeding a desired amount of the coolant of the load unit flows to an exhaust tank and returns to the inlet side of the pump drive unit, in response to the desired amount of the coolant of the load unit being lower than a minimum flow of the outlet side of the pump drive unit.

19. The liquid cooling heat dissipation system according to claim 17, wherein the drive unit is further configured to:

in response to the temperature value collected by the secondary side liquid return temperature sensor being lower than a second preset temperature value lower than the first preset temperature value, reducing pumping power of the pump drive unit to increase the negative pressure of the negative pressure line.

* * * * *